(12) United States Patent
Wu et al.

(10) Patent No.: US 11,476,432 B2
(45) Date of Patent: Oct. 18, 2022

(54) INVERTED THICK 2D HYBRID PEROVSKITE SOLAR CELL INSENSITIVE TO FILM THICKNESS AND METHOD FOR PREPARING THE SAME

(71) Applicant: ZHEJIANG UNIVERSITY, Hangzhou (CN)

(72) Inventors: Gang Wu, Hangzhou (CN); Xiaomei Lian, Hangzhou (CN); Jiehuan Chen, Hangzhou (CN); Hongzheng Chen, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 85 days.

(21) Appl. No.: 17/149,740

(22) Filed: Jan. 15, 2021

(65) Prior Publication Data
US 2021/0135135 A1 May 6, 2021

Related U.S. Application Data

(63) Continuation of application No. PCT/CN2019/098048, filed on Jul. 26, 2019.

(30) Foreign Application Priority Data

Apr. 11, 2019 (CN) .......................... 201910289598.3

(51) Int. Cl.
H01L 51/42 (2006.01)
H01L 51/44 (2006.01)
H01L 51/00 (2006.01)

(52) U.S. Cl.
CPC ........ H01L 51/4213 (2013.01); H01L 51/007 (2013.01); H01L 51/442 (2013.01)

(58) Field of Classification Search
CPC .. H01L 51/4213; H01L 51/007; H01L 51/442
See application file for complete search history.

(56) References Cited

U.S. PATENT DOCUMENTS

2017/0244057 A1    8/2017   Zhu et al.

FOREIGN PATENT DOCUMENTS

| CN | 106784325 A | 5/2017 |
| CN | 106803538 A | 6/2017 |

(Continued)

OTHER PUBLICATIONS

Soe et al., New Type of 2D Perovskites with Alternating Cations in the Interlayer Space, (C(NH2)3)(CH3NH3)nPbnI3n+1: Structure, Properties, and Photovoltaic Performance, Journal of the American Chemical Society, vol./issue 139 pp. 16297-16309 (Year: 2017).*

(Continued)

*Primary Examiner* — Jayne L Mershon
(74) *Attorney, Agent, or Firm* — W&G Law Group

(57) ABSTRACT

Provided are an inverted thick 2D hybrid perovskite solar cell insensitive to film thickness and a preparation method thereof, belonging to the field of organic-inorganic hybrid perovskite materials. The solar cell adopts a 2D hybrid perovskite thick-film material as a light absorption layer having thickness in a range of 500-800 nm, which is conducive to the full absorption of sunlight. The thick-film film material can be deposited from a precursor solution added with guanidine hydroiodide, and is composed of large grains growing along the thickness direction. The solar cell with an inverted structure prepared by using the thick-film material as a light absorption layer has an efficiency fluctuation less than 5% in a film thickness range of 500-800 nm. This is of great value for the preparation of high-performance hybrid perovskite solar cells by a large-area solution method.

1 Claim, 1 Drawing Sheet

(56) References Cited

FOREIGN PATENT DOCUMENTS

| CN | 106816532 A | 6/2017 |
| --- | --- | --- |
| CN | 108987584 A | 12/2018 |
| JP | 2018533195 A | 11/2018 |

OTHER PUBLICATIONS

Jodlowski et al., Large guanidinium cation mixed with methylammonium in lead iodide perovskites for 19% efficient solar cells, Nature Energy, Articles, vol. 2, pp. 972-979 (Year: 2017).*
First Office Action [2020-529152] (dated Jul. 20, 2021).
"Non-official translation: Study on Interface Electronic Structure in Perovskite Solar Cells" Ji, Gengwu [Jul. 15, 2017].
International Search Report (PCT/CN2019/098048); dated Jan. 3, 2020.

\* cited by examiner

INVERTED THICK 2D HYBRID PEROVSKITE SOLAR CELL INSENSITIVE TO FILM THICKNESS AND METHOD FOR PREPARING THE SAME

TECHNICAL FIELD

The present application belongs to the field of organic-inorganic hybrid perovskite materials, and particularly, relates to an inverted thick 2D hybrid perovskite solar cell insensitive to film thickness, and a preparation method thereof.

BACKGROUND

With the continuous advance in the efficiency of 3D organic-inorganic hybrid perovskite solar cells, their stability attracts more attentions. The 2D perovskite materials have better moisture resistance than the 3D perovskite materials, but have lower efficiency of solar cells than the 3D perovskite solar cells.

It is beneficial to obtain high-efficiency 2D perovskite solar cells by improving a carrier transport ability of a 2D perovskite thin film material and improving its ability of absorbing sunlight. At present, remarkable research progress has been made in improving the carrier transport capacity of 2D perovskite thin films. By employing thermal spin coating, additives or mixed solvents, the grains in 2D perovskite thin films can grow vertically to the substrate, which is beneficial to a rapid transport of photo-generated carriers. However, the 2D perovskite film prepared by these methods on a PEDOT: PSS substrate has a thickness generally ranging from 200 nm to 350 nm. The reason is in that, when the film grows due to the anisotropy of the crystal structure of the 2D perovskite material, the grains in the film can only maintain vertical orientation in a thin thickness range (<300 nm), which results in an increase of the thickness of 2D perovskite film, an increase of grain boundaries in the thickness direction and a decrease of the film quality, thereby leading to a decrease of transport capacity of the carriers and the decrease of photoelectric conversion efficiency of the solar cell. The PEDOT: PSS substrate is commonly used for solar cells with an inverted structure, and the inverted structure is a device structure which is conducive to the large-area preparation of the solar cell. Therefore, by preparing a high-quality 2D perovskite thick-film (>500 nm) material on the PEDOT: PSS substrate, sunlight can be fully absorbed, and an efficiency of the solar cell can be effectively improved. In addition, when the hybrid perovskite cell is prepared by a large-area solution method, the thickness of the hybrid perovskite film is often not completely consistent, resulting in excessive fluctuation of the performance of the device. Therefore, it is also very important that the efficiency of a hybrid perovskite cell is less sensitive to the thickness of the hybrid perovskite film. Currently, a preparation of a 2D hybrid perovskite solar cell with an inverted structure insensitive to film thickness has not been publically reported yet.

SUMMARY

An object of the present disclosure is to solve the above problems in the prior art and to provide an inverted thick 2D hybrid perovskite solar cell insensitive to film thickness. The solar cell adopts a 2D hybrid perovskite thick-film material as a light absorption layer, and has a thickness in a range of 500-800 nm, which is conducive to the full absorption of sunlight. The thick film material can be deposited from a precursor solution added with guanidine hydroiodide and is composed of large grains growing along the thickness direction. The cell efficiency is insensitive to the film thickness in the thickness range of 500-800 nm, thereby avoiding the performance fluctuation of the device caused by uneven film thickness in the preparation process.

The specific technical solution adopted by the present disclosure is as follows:

An inverted thick 2D hybrid perovskite solar cell insensitive to film thickness includes a light absorption layer. The light absorption layer of the solar cell is a 2D hybrid perovskite thick-film material that is obtained by a deposition of a precursor solution. The precursor solution is a mixture of methylamine hydroiodide, spacer cationic hydroiodide, guanidine hydroiodide, lead iodide and an organic solvent. The spacer cationic hydroiodide is a hydroiodide of one of n-butylamine, phenylethylamine, benzylamine, t-butylamine or isobutylamine. The 2D hybrid perovskite thick-film material has a thickness ranging from 500 nm to 800 nm, and the cell has a fluctuation range of efficiency less than 5%.

Based on this solution, the present disclosure further provides one or more of the following preferred implementations. It should be understood that the technical features of each preferred implementation in the present disclosure can be combined without conflict with each other.

Preferably, the organic solvent is selected from the group consisting of formamide, dimethyl sulfoxide, N, N-dimethylformamide, and combinations thereof.

Preferably, in the precursor solution, a ratio of lead iodide to the organic solvent ranges from 250 mg: 1 ml to 400 mg: 1 ml.

Preferably, in the precursor solution, a molar ratio of the spacer cation hydroiodide:guanidine hydroiodide:methylamine hydroiodide:lead iodide is $(2-2x)$: $x$:2:3 or $(2-2x)$: $x$:3:4 or $(2-2x)$: $x$:4:5, where $x$ ranges from 0.01 to 0.3.

Preferably, the deposition is performed by spin-coating the precursor solution on a substrate to form a film, and annealing.

Further, during the spin coating, a temperature of the substrate and a temperature of the precursor solution are both in a range of 25° C. to 150° C.

Further, a temperature for annealing ranges from 70° C. to 150° C., and a time for annealing ranges from 5 min to 20 min.

Further, the substrate is an ITO glass covered with a PEDOT: PSS.

Further, the solar cell has a multi-layer structure, and the multi-layer structure, from bottom to top, comprises: an ITO glass, a PEDOT: PSS layer, a light absorption layer, a PC61BM layer, a BCP layer, and a silver electrode layer.

Another object of the present disclosure is to provide a method for preparing an inverted thick 2D hybrid perovskite solar cell insensitive to film thickness. The method includes: a first step of preparing an ITO glass substrate coated with a PEDOT: PSS layer; a second step of mixing methylamine hydroiodide, spacer cationic hydroiodide, guanidine hydroiodide, lead iodide and an organic solvent to prepare a precursor solution, wherein the spacer cationic hydroiodide is a hydroiodide of one of n-butylamine, phenylethylamine, benzylamine, t-butylamine or isobutylamine; the organic solvent is selected from the group consisting of formamide, dimethyl sulfoxide, N, N-dimethylformamide, and combinations thereof; in the precursor solution, a molar ratio of the spacer cation hydroiodide:guanidine hydroiodide:methylamine hydroiodide:lead iodide is $(2-2x)$: $x$:2:3, or $(2-2x)$:

x:3:4, or (2−2x): x:4:5, where x=0.01-0.3; and a ratio of lead iodide to the organic solvent ranges from 250 mg: 1 ml to 400 mg: 1 ml; a third step of spin-coating the precursor solution on the ITO glass substrate to form a film, and then annealing, to obtain a light absorption layer, wherein during the spin coating, a temperature of the substrate and a temperature of the precursor solution are both in a range of 25° C. to 150° C.; a temperature for annealing ranges from 70° C. to 150° C., and a time for annealing ranges from 5 min to 20 min; and a fourth step of sequentially spin-coating a $PC_{61}BM$ layer and a BCP layer on a surface of the light absorption layer, and then vapor-depositing a silver layer as an electrode layer.

In the present disclosure, a high-quality 2D hybrid perovskite thick-film material is adopted to prepare an inverted solar cell insensitive to film thickness. On the one hand, the light absorption layer of the solar cell is composed of a 500 nm-800 nm thick high-quality 2D hybrid perovskite film with good orientation and few defects, which improves the light absorption while maintaining good carrier transmission characteristics, thereby improving the efficiency of the cell. In addition, in the thickness range of 500-800 nm, the efficiency fluctuation of cell efficiency is less than 5%, which is beneficial to realize large-area manufacturing. The method is of great significance for realizing high-efficiency photoelectric devices capable of large-area solution processing.

DESCRIPTION OF EMBODIMENTS

Figure 1:
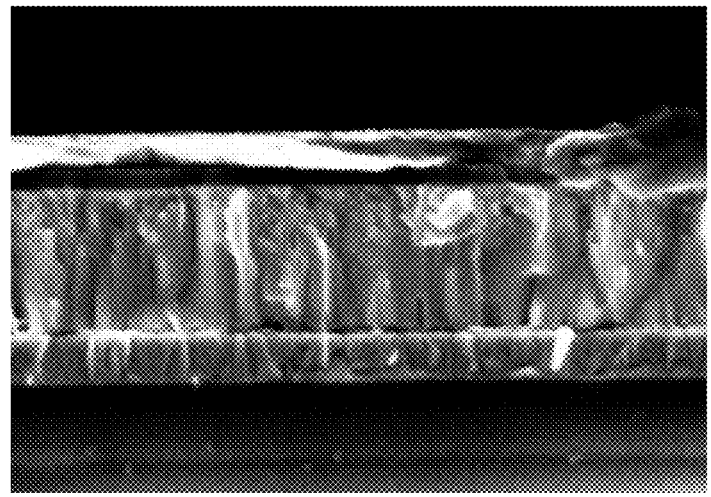
FIG. 1 is a cross-sectional SEM image of a 2D hybrid perovskite thick-film material.

The method for preparing an inverted thick 2D hybrid perovskite solar cell insensitive to film thickness includes the following steps of: firstly, spin-coating a PEDOT: PSS layer on an ITO glass to prepare a substrate; subsequently, mixing methylamine hydroiodide, spacer cationic hydroiodide, guanidine hydroiodide, lead iodide and an organic solvent to prepare a precursor solution, wherein the spacer cationic hydroiodide is hydroiodide of one of n-butylamine, phenylethylamine, benzylamine, t-butylamine or isobutylamine, the organic solvent is selected from the group consisting of formamide, dimethyl sulfoxide and N, N-dimethylformamide, and combinations thereof, in the precursor solution, a molar ratio of the spacer cation hydroiodide: guanidine hydroiodide:methylamine hydroiodide:lead iodide is (2−2x): x:2:3 or (2−2x): x:3:4 or (2−2x): x:4:5, where x=0.01-0.3, and a ratio of lead iodide to the organic solvent is 250-400 mg: 1 ml; then, spin-coating the precursor solution on the ITO glass substrate to form a film, and annealing to obtain a light absorption layer, during spin coating, a temperature of the substrate and a temperature of the precursor solution both range from 25° C. to 150° C., a temperature for annealing ranges from 70° C. to 150° C., and a time for annealing ranges from 5 min to 20 min; and finally, sequentially spin-coating a $PC_{61}BM$ layer and a BCP layer on the surface of the light absorption layer, and finally vapor-depositing a silver layer as an electrode layer.

Based on the above preparation method, the present disclosure will be described in details by means of the following examples:

Example 1

An ITO glass substrate was ultrasonically washed respectively with a detergent, acetone, isopropanol, and ethanol for 5 minutes, then rinsed with deionized water and dried. After the dried ITO glass substrate was subjected to a treatment of ultraviolet ozone, a PEDOT: PSS layer with a thickness of about 25 nm was prepared by spin coating, and the PEDOT: PSS layer was baked at 140° C. for 15 minutes and then taken out. Phenylethylamine hydroiodide, guanidine hydroiodide, methylamine hydroiodide and lead iodide were mixed and dissolved in N, N-dimethylformamide, in which a ratio of lead iodide to N, N-dimethylformamide was M mg:1 mL; a molar ratio of phenylethylamine hydroiodide: guanidine hydroiodide:methylamine hydroiodide:lead iodide was (2−2x): x:2:3, where x=0.01, so as to obtain a precursor solution by stirring overnight. As a light absorption layer of the cell, a 2D hybrid perovskite thick-film material with a certain thickness was obtained by spin-coating the precursor solution on the PEDOT: PSS layer on the surface of the ITO glass substrate at 25° C. and then annealing at 70° C. for 5 minutes. Then, a layer of $PC_{61}BM$ and a layer of BCP were sequentially spin-coated on the light absorption layer. Finally, a silver electrode layer of 100 nm was vapor-deposited, so as to obtain an inverted thick 2D hybrid perovskite solar cell.

Figure 2:
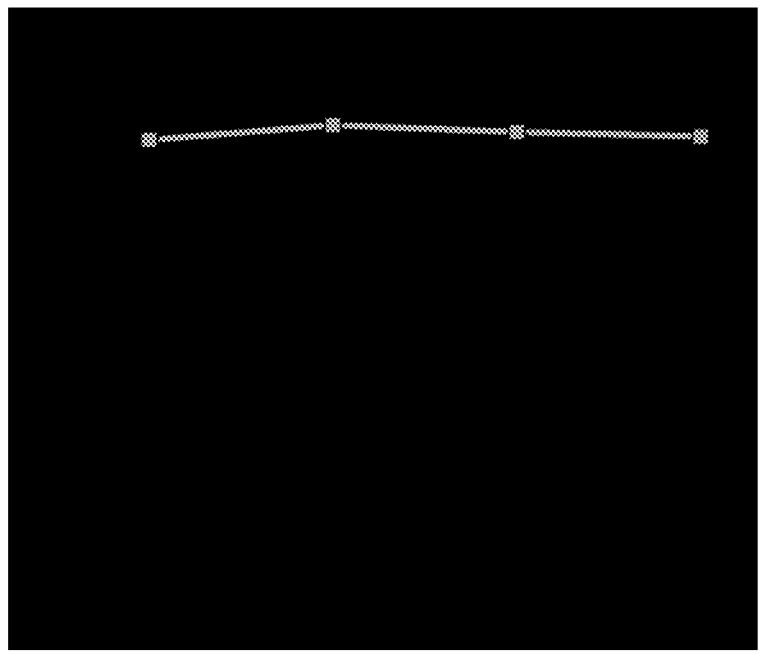
FIG. 2 illustrates a relationship between a photoelectric conversion efficiency of a hybrid perovskite solar cell and a thickness of a 2D hybrid perovskite thick-film material.

The SEM image of FIG. 1 indicates that the 2D hybrid perovskite thick-film material is composed of large grains oriented along the thickness direction. In this embodiment, in order to reflect the relationship between the 2D hybrid perovskite thick-film material and the film thickness, four groups of different light absorption layer thicknesses were set, which were 500 nm, 600 nm, 700 nm and 800 nm respectively. The regulation of the thickness of the light absorption layer was realized by changing the ratio of lead iodide to N, N-dimethylformamide. In the light absorption layers of 500 nm, 600 nm, 700 nm and 800 nm, the values of M were 250, 300, 350 and 400, respectively. The photoelectric conversion efficiencies (PCE) of the solar cells with different film thickness were measured. FIG. 2 indicates that, with the increase of the thickness of the 2D hybrid perovskite thick-film material, the photoelectric conversion efficiency of the solar cell remains basically constant: with the thicknesses of 500 nm, 600 nm, 700 nm and 800 nm, the photoelectric conversion efficiencies were 15.7%, 16.26%, 16%, 15.83% in turn, and the fluctuation was less than 5%, indicating that the device performance was not sensitive to the thickness.

Example 2

An ITO glass substrate was ultrasonically washed respectively with a detergent, acetone, isopropanol, and ethanol for 5 minutes, then rinsed with deionized water and dried. After the dried ITO glass substrate was subjected to a treatment of ultraviolet ozone, a PEDOT: PSS layer with a thickness of about 25 nm was prepared by spin coating, and the PEDOT: PSS layer was baked at 140° C. for 15 minutes and then taken out. N-butylamine hydroiodide, guanidine hydroiodide, methylamine hydroiodide and lead iodide were mixed and dissolved in formamide, in which the molar ratio of n-butylamine hydroiodide:guanidine hydroiodide:methylamine hydroiodide:lead iodide was (2−2x): x:4:5, where x=0.3, so as to obtain a precursor solution by stirring overnight. A 2D hybrid perovskite thick-film material with a thickness greater than 500 nm was obtained by spin-coating the precursor solution on the PEDOT: PSS layer on the surface of the ITO glass substrate at 150° C. and then annealing at 150° C. for 20 minutes. The cross-sectional morphology of the film was investigated, and the scanning electron microscope (SEM) photo obtained was similar to that in FIG. 1. Then, a layer of $PC_{61}BM$ and a layer of BCP were sequentially spin-coated. Finally, a silver electrode layer of 100 nm was vapor-deposited, so as to obtain an inverted thick 2D hybrid perovskite solar cell. In this example, different film thicknesses were also regulated by changing the ratio of lead iodide to formamide, and the relationship between the thickness and the ratio was the same as that in Example 1. The change of photoelectric conversion efficiency with the increase of the thickness of the thick film was similar to that in FIG. 2, indicating that the cell efficiency was insensitive to the thickness of thick-film material.

Example 3

An ITO glass substrate was ultrasonically washed with a detergent, acetone, isopropanol, and ethanol respectively for 5 minutes, then rinsed with deionized water and dried. After the dried ITO glass substrate was subjected to a treatment of ultraviolet ozone, a PEDOT: PSS layer with a thickness of about 25 nm was prepared by spin coating, and the PEDOT: PSS layer was baked at 140° C. for 15 minutes and then taken out. T-butylamine hydroiodide, guanidine hydroiodide, methylamine hydroiodide and lead iodide were mixed and dissolved in dimethyl sulfoxide, in which the molar ratio of t-butylamine hydroiodide:guanidine hydroiodide:methylamine hydroiodide:lead iodide was (2−2x): x:3:4, where x=0.2, so as to obtain a precursor solution by stirring overnight. A 2D hybrid perovskite thick-film material with a thickness greater than 500 nm was obtained by spin-coating the precursor solution on the PEDOT: PSS layer on the surface of the ITO glass substrate at 70° C. and annealing at 100° C. for 15 minutes. The cross-sectional morphology of the film was investigated, and the scanning electron microscope (SEM) photo obtained was similar to that in FIG. 1. Then, a layer of $PC_{61}BM$ and a layer of BCP were sequentially spin-coated, and finally, a silver electrode layer of 100 nm was vapor-deposited, so as to obtain an inverted thick 2D hybrid perovskite solar cell. In this example, different film thicknesses were also regulated by changing the ratio of lead iodide to dimethyl sulfoxide, and the relationship between the thickness and the ratio was the same as that in Example 1. The change of photoelectric conversion efficiency with the increase of the thickness of the thick film was similar to that in FIG. 2, indicating that the cell efficiency was insensitive to the thickness of thick-film material.

Example 4

An ITO glass substrate was ultrasonically washed respectively with a detergent, acetone, isopropanol, and ethanol for 5 minutes, then rinsed with deionized water and dried. After the dried ITO glass substrate was subjected to a treatment of ultraviolet ozone, a PEDOT: PSS layer with a thickness of about 25 nm was prepared by spin coating, and the PEDOT: PSS layer was baked at 140° C. for 15 minutes and then taken out. Isobutylamine hydroiodide, guanidine hydroiodide, methylamine hydroiodide and lead iodide were mixed and dissolved in N, N-dimethylformamide/dimethyl sulfoxide, in which the molar ratio of isobutylamine hydroiodide: guanidine hydroiodide:methylamine hydroiodide:lead iodide was (2−2x): x:4:5, where x=0.1, so as to obtain a precursor solution by stirring overnight. A 2D hybrid perovskite thick-film material with a thickness greater than 500 nm was obtained by spin-coating the precursor solution on the PEDOT: PSS layer on the surface of the ITO glass substrate at 80° C. and then annealing at 90° C. for 10 minutes. The cross-sectional morphology of the film was investigated, and the scanning electron microscope (SEM) photo obtained was similar to that in FIG. 1. Then, a layer of $PC_{61}BM$ and a layer of BCP were sequentially spin-coated, and finally, a silver electrode layer of 100 nm was vapor-deposited, so as to obtain an inverted thick 2D hybrid perovskite solar cell. In this example, different film thicknesses were also regulated by changing the ratio of lead iodide to N, N-dimethylformamide/dimethyl sulfoxide, and the relationship between the thickness and the ratio was the same as that in Example 1. The change of photoelectric conversion efficiency with the increase of the thickness of the thick film was similar to that in FIG. 2, indicating that the cell efficiency was insensitive to the thickness of thick-film material.

Example 5

An ITO glass substrate was ultrasonically washed respectively with a detergent, acetone, isopropanol, and ethanol for 5 minutes, then rinsed with deionized water and dried. After the dried ITO glass substrate was subjected to a treatment of ultraviolet ozone, a PEDOT: PSS layer with a thickness of about 25 nm was prepared by spin coating, and the PEDOT: PSS layer was baked at 140° C. for 15 minutes and then taken out. Isobutylamine hydroiodide, guanidine hydroiodide, methylamine hydroiodide and lead iodide were mixed and dissolved in N, N-dimethylformamide/formamide, wherein the molar ratio of isobutylamine hydroiodide:guanidine hydroiodide:methylamine hydroiodide:lead iodide was (2−2x): x:3:4, where x=0.05, so as to obtain a precursor solution by stirring overnight. A 2D hybrid perovskite thick-film material with a thickness greater than 500 nm was obtained by spin-coating the precursor solution on the PEDOT: PSS layer on the surface of the ITO glass substrate at 50° C. and then annealing at 120° C. for 12 minutes. The cross-sectional morphology of the film was investigated, and the scanning electron microscope (SEM) photo obtained was similar to that in FIG. 1. Then, a layer of $PC_{61}BM$ and a layer of BCP were sequentially spin-coated, and finally, a silver electrode layer of 100 nm was vapor-deposited, so as to obtain an inverted thick 2D hybrid perovskite solar cell. In this example, different film thicknesses were also regulated by changing the ratio of lead iodide to N, N-dimethylformamide/formamide, and the relationship between the thickness and the ratio was the same as that in Example 1. The change of photoelectric conversion efficiency with the increase of the thickness of the thick film was similar to that in FIG. 2, indicating that the cell efficiency was insensitive to the thickness of thick-film material.

Example 6

An ITO glass substrate was ultrasonically washed respectively with a detergent, acetone, isopropanol, and ethanol for 5 minutes, then rinsed with deionized water and dried. After the dried ITO glass substrate was subjected to a treatment of ultraviolet ozone, a PEDOT: PSS layer with a thickness of about 25 nm was prepared by spin coating, and the PEDOT: PSS layer was baked at 140° C. for 15 minutes and then taken out. Benzylamine hydroiodide, guanidine hydroiodide, methylamine hydroiodide and lead iodide were mixed and dissolved in dimethyl sulfoxide/formamide, in which the molar ratio of benzylamine hydroiodide:guanidine hydroiodide:methylamine hydroiodide:lead iodide was (2−2x): x:2:3, where x=0.25, so as to obtain a precursor solution by stirring overnight. A 2D hybrid perovskite thick-film material with a thickness greater than 500 nm was obtained by spin-coating the precursor solution on the PEDOT: PSS layer on the surface of the ITO glass substrate at 120° C. and annealing at 130° C. for 10 minutes. The cross-sectional morphology of the film was investigated, and the scanning electron microscope (SEM) photo obtained was similar to that in FIG. 1. Then, a layer of $PC_{61}BM$ and a layer of BCP were sequentially spin-coated, and finally, a silver electrode layer of 100 nm was vapor-deposited, so as to obtain an inverted thick 2D hybrid perovskite solar cell. In this example, different film thicknesses were also regulated by changing the ratio of lead iodide to dimethyl sulfoxide/formamide, and the relationship between the thickness and the ratio was the same as that in Example 1. The change of photoelectric conversion efficiency with the increase of the thickness of the thick film was similar to that in FIG. 2, indicating that the cell efficiency was insensitive to the thickness of thick-film material.

Example 7

An ITO glass substrate was ultrasonically washed respectively with a detergent, acetone, isopropanol, and ethanol for 5 minutes, then rinsed with deionized water and dried. After the dried ITO glass substrate was subjected to a treatment of ultraviolet ozone, a PEDOT: PSS layer with a thickness of about 25 nm was prepared by spin coating, and the PEDOT: PSS layer was baked at 140° C. for 15 minutes and then taken out. T-butylamine hydroiodide, guanidine hydroiodide, methylamine hydroiodide and lead iodide were mixed and dissolved in N, N-dimethylformamide/dimethyl sulfoxide, in which the molar ratio of t-butylamine hydroiodide: guanidine hydroiodide:methylamine hydroiodide:lead iodide was (2−2x): x:4:5, where x=0.2, so as to obtain a precursor solution by stirring overnight. A 2D hybrid perovskite thick-film material with a thickness greater than 500 nm was obtained by spin-coating the precursor solution at 40° C. on the PEDOT: PSS layer on the surface of the ITO glass substrate at 40° C. and annealing at 140° C. for 20 minutes. The cross-sectional morphology of the film was investigated, and the scanning electron microscope (SEM) photo obtained was similar to that in FIG. 1. Then, a layer of $PC_{61}BM$ and a layer of BCP were sequentially spin-coated, and finally, a silver electrode layer of 100 nm was vapor-deposited, so as to obtain an inverted thick 2D hybrid perovskite solar cell. In this example, different film thicknesses were also regulated by changing the ratio of lead iodide to N, N-dimethylformamide/dimethyl sulfoxide, and the relationship between the thickness and the ratio was the same as that in Example 1. The change of photoelectric conversion efficiency with the increase of the thickness of the thick film was similar to that in FIG. 2, indicating that the cell efficiency was insensitive to the thickness of thick-film material.

Example 8

An ITO glass substrate was ultrasonically washed with a detergent, acetone, isopropanol, and ethanol respectively for 5 minutes, then rinsed with deionized water and dried. After the dried ITO glass substrate was subjected to a treatment of ultraviolet ozone, a PEDOT: PSS layer with a thickness of about 25 nm was prepared by spin coating, and the PEDOT: PSS layer was baked at 140° C. for 15 minutes and then taken out. T-butylamine hydroiodide, guanidine hydroiodide, methylamine hydroiodide and lead iodide were mixed and dissolved in N, N-dimethylformamide, in which the molar ratio of t-butylamine hydroiodide:guanidine hydroiodide:methylamine hydroiodide:lead iodide was (2−2x): x:3:4 where x=0.15, so as to obtain a precursor solution by stirring overnight. A 2D hybrid perovskite thick-film material with a thickness greater than 500 nm was obtained by spin-coating the precursor solution at 100° C. on the PEDOT: PSS layer on the surface of the ITO glass substrate at 100° C. and annealing at 150° C. for 15 minutes. The cross-sectional morphology of the film was investigated, and the scanning electron microscope (SEM) photo obtained was similar to that in FIG. 1. Then, a layer of $PC_{61}BM$ and a layer of BCP were sequentially spin-coated, and finally, a silver electrode layer of 100 nm was vapor-deposited, so as to obtain an inverted thick 2D hybrid perovskite solar cell. In this example, different film thicknesses were also regulated by changing the ratio of lead iodide to N, N-dimethylformamide, and the relationship between the thickness and the ratio was the same as that in Example 1. The change of photoelectric conversion efficiency with the increase of the thickness of the thick film was similar to that in FIG. 2, indicating that the cell efficiency was insensitive to the thickness of thick-film material.

What is claimed is:

1. A method for preparing an inverted thick 2D hybrid perovskite solar cell insensitive to film thickness, the method comprising:
   a first step of preparing an ITO glass substrate coated with a PEDOT: PSS layer;
   a second step of mixing methylamine hydroiodide, spacer cationic hydroiodide, guanidine hydroiodide, lead iodide and an organic solvent to prepare a precursor solution, wherein the spacer cationic hydroiodide is a hydroiodide of one of n-butylamine, phenylethylamine, benzylamine, t-butylamine or isobutylamine; the organic solvent is selected from the group consisting of formamide, dimethyl sulfoxide, N, N-dimethylformamide, and combinations thereof; in the precursor solution, a molar ratio of the spacer cation hydroiodide: guanidine hydroiodide:methylamine hydroiodide:lead iodide is (2−2x): x:2:3, or (2−2x): x:3:4, or (2−2x): x:4:5, where x=0.01-0.3; and a ratio of lead iodide to the organic solvent ranges from 250 mg: 1 ml to 400 mg: 1 ml;
   a third step of spin-coating the precursor solution on the ITO glass substrate to form a film, and then annealing, to obtain a light absorption layer, wherein during the spin coating, a temperature of the substrate and a temperature of the precursor solution are both in a range of 25° C. to 150° C.; a temperature for annealing ranges from 70° C. to 150° C., and a time for annealing ranges from 5 min to 20 min; and
   a fourth step of sequentially spin-coating a PC61BM layer and a BCP layer on a surface of the light absorption layer, and then vapor-depositing a silver layer as an electrode layer.

* * * * *